(12) United States Patent
Mahler et al.

(10) Patent No.: US 7,642,641 B2
(45) Date of Patent: Jan. 5, 2010

(54) INTEGRATED CIRCUIT COMPONENT WITH PASSIVATION LAYER

(75) Inventors: Joachim Mahler, Regensburg (DE); Ralf Otremba, Kaufbeuren (DE); Bernd Betz, Obertraubling/Oberhinkofen (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 63 days.

(21) Appl. No.: 11/756,303

(22) Filed: May 31, 2007

(65) Prior Publication Data

US 2008/0093728 A1     Apr. 24, 2008

Related U.S. Application Data

(63) Continuation of application No. PCT/DE2005/001920, filed on Oct. 26, 2005.

(30) Foreign Application Priority Data

Dec. 2, 2004   (DE) .................... 10 2004 058 305

(51) Int. Cl.
*H01L 23/14* (2006.01)
*H01L 23/24* (2006.01)
*H01L 23/31* (2006.01)
*H01L 23/29* (2006.01)
*H01L 21/52* (2006.01)
*H01L 21/56* (2006.01)

(52) U.S. Cl. .............. 257/701; 257/E23.003; 257/E23.119; 257/E23.121; 257/E23.129; 257/E23.132; 257/E21.5; 257/E21.502; 257/666; 257/784; 257/786; 257/790; 257/676

(58) Field of Classification Search ........... 257/701, 257/790, 789, 788, 786, 784, 666, 690, 691, 257/692, 693, 696, 698, 676, E21.5, E21.502, 257/E23.003, E23.119, E23.121, E23.129, 257/E23.132; 438/110
See application file for complete search history.

(56) References Cited

U.S. PATENT DOCUMENTS

| | | | |
|---|---|---|---|
| 5,097,317 A * | 3/1992 | Fujimoto et al. ........... 257/786 |
| 5,287,003 A * | 2/1994 | Van Andel et al. ......... 257/792 |
| 5,336,532 A | 8/1994 | Haluska et al. |
| 6,097,386 A | 8/2000 | Bardon et al. |
| 6,245,849 B1 | 6/2001 | Morales et al. |
| 6,469,086 B1 | 10/2002 | Neu et al. |
| 6,495,208 B1 | 12/2002 | Desu et al. |
| 6,549,028 B1 * | 4/2003 | Ohlhoff ..................... 324/765 |
| 6,667,360 B1 * | 12/2003 | Ng et al. .................... 524/492 |
| 6,933,595 B2 | 8/2005 | Reiss et al. |
| 7,009,288 B2 * | 3/2006 | Bauer et al. ................ 257/690 |
| 2002/0027268 A1 * | 3/2002 | Tanaka et al. .............. 257/666 |

(Continued)

FOREIGN PATENT DOCUMENTS

WO     03060985 A1     7/2003

(Continued)

*Primary Examiner*—Alexander O Williams
(74) *Attorney, Agent, or Firm*—Edell, Shapiro & Finnan, LLC

(57) ABSTRACT

A semiconductor component includes a semiconductor chip provided with a passivation layer that covers the topmost interconnect structure of the semiconductor chip whilst leaving contact areas free. The passivation layer is in direct adhesive contact with the plastic housing composition of the semiconductor component. The passivation layer includes a polymer with embedded mineral-ceramic nanoparticles.

11 Claims, 5 Drawing Sheets

U.S. PATENT DOCUMENTS

| | | |
|---|---|---|
| 2003/0174994 A1 | 9/2003 | Garito et al. |
| 2003/0207978 A1* | 11/2003 | Yadav et al. ................ 524/435 |
| 2004/0121073 A1* | 6/2004 | George et al. ............... 427/215 |
| 2004/0234766 A1 | 11/2004 | Liu et al. |
| 2006/0097386 A1 | 5/2006 | Ertle et al. |
| 2006/0163744 A1* | 7/2006 | Vanheusden et al. ........ 257/773 |
| 2007/0085225 A1* | 4/2007 | Mengel ...................... 257/792 |
| 2007/0235857 A1* | 10/2007 | Bauer et al. .................. 257/702 |
| 2008/0015284 A1* | 1/2008 | Cakmak et al. ................ 524/1 |
| 2008/0054441 A1* | 3/2008 | Lin ............................ 257/692 |
| 2008/0093979 A1* | 4/2008 | Bechtel et al. ............... 313/503 |

FOREIGN PATENT DOCUMENTS

WO    2006005304 A2    1/2006

* cited by examiner

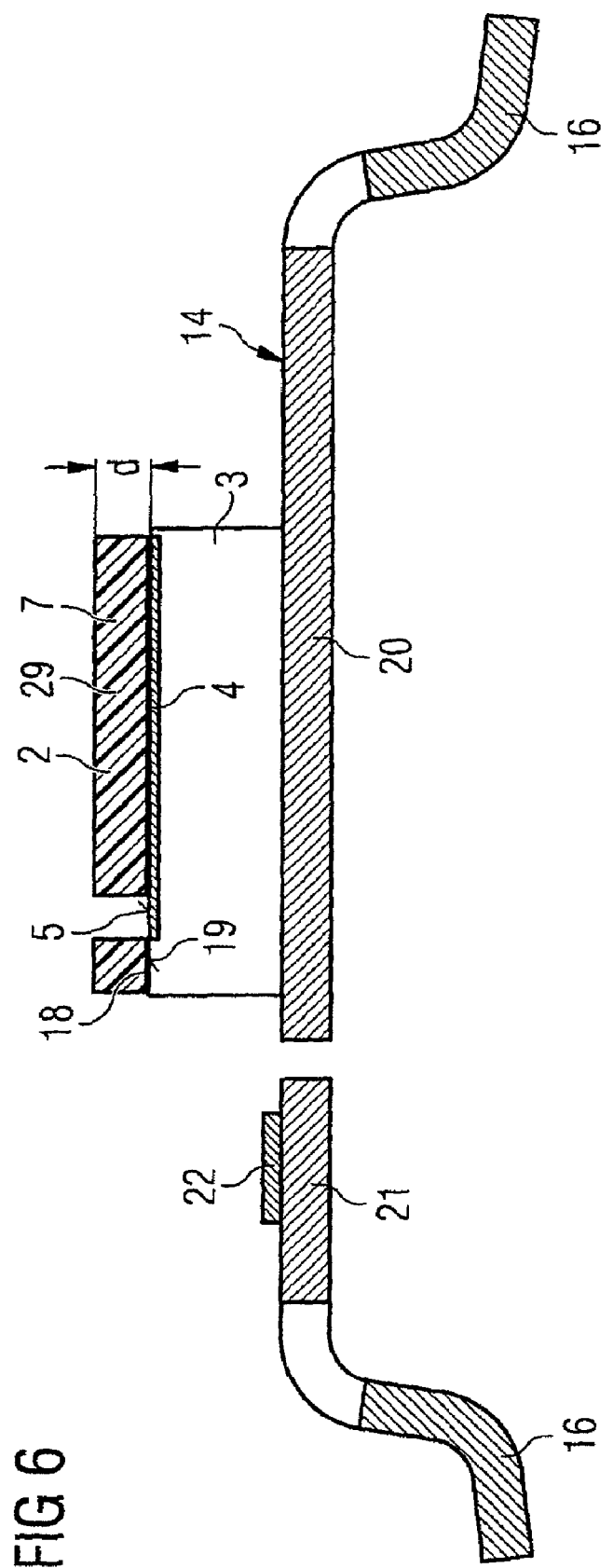

INTEGRATED CIRCUIT COMPONENT WITH PASSIVATION LAYER

The invention relates to a semiconductor component comprising a semiconductor chip provided with a passivation layer, and to methods for producing the same.

BACKGROUND

The construction of passivation layers of this type is known from the document DE 102 34 648. Passivation layers of this type comprise a silicon nitride layer, which covers the topmost interconnect structure of the semiconductor chip, and a polyimide layer arranged on the silicon nitride layer. While the silicon nitride layer ensures that no metallic ions diffuse into the insulation layers composed of silicon dioxide on the top side of a semiconductor chip to the sensitive PN junction zones, the polyimide layer ensures that the transition from the ceramic silicon nitride layer to a plastic housing composition is improved in order to minimize delaminations between the top side of the semiconductor chip and the plastic housing composition.

The passivation layer composed of silicon nitride has hitherto been applied to the aluminum metallization layer of the interconnect structure in front-end fashion with the disadvantage of a relatively high hardness and brittleness of the silicon nitride layer, which, in the case of increased mechanical stress, can lead to fractures in said passivation layer composed of silicon nitride and thus causes corrosion of the aluminum metallization lying at a deeper level. Onto this ceramic insulation layer, as described above, a polyimide layer is applied to the chip surface in order to improve the adhesiveness of a plastic housing composition with the chip top side. However, said passivation layer has the disadvantage that a thermal insulation of the semiconductor chip surface is also associated therewith, especially as the thermal conductivity of the polyimide is approximately a factor of 100 poorer than the thermal conductivity of the silicon nitride. Moreover, the application of a ceramic layer composed of silicon nitride and the subsequent application of a polyimide layer are not unproblematic. The methods used for this purpose are cost-intensive especially as the polyimide layer and the silicon nitride layer are applied in two different processes in the front end, which does not reduce the costs in terms of production technology.

SUMMARY

It is an object of the invention to specify a semiconductor component comprising a semiconductor chip provided with a passivation layer and a method for producing the same in which a better heat transfer from the semiconductor chip surface to the plastic housing composition is achieved compared with the heat transfer in the known polyimide layer. Furthermore, it is an object of the invention to simplify production and to specify a method which both prevents diffusion of metal ions into the insulation layers of a semiconductor chip and improves the coupling of the plastic housing composition to the semiconductor chip.

This object is achieved by means of the subject matter of the independent claims. Advantageous developments of the invention emerge from the dependent claims.

The invention provides a semiconductor component comprising a semiconductor chip provided with a passivation layer, in which the passivation layer covers the topmost interconnect structure of the semiconductor chip whilst leaving contact areas free. Said passivation layer is in direct adhesive contact both with the topmost interconnect structure and with a plastic housing composition of the semiconductor component and comprises a polymer with incorporated mineral-ceramic nanoparticles.

Said passivation layer has the advantage that it provides a sufficient electrical insulation strength and a mechanical protection of the metallization against scratch and fracture loadings. Consequently, what is achieved with this polymer layer with mineral-ceramic nanoparticles is that the interface between passivation layer and metallization prevents irreversible damage to the chip top side during operation of the semiconductor component.

Such irreversible damage can be caused by ceramic particles present as fillers in the plastic housing composition, as is known from the document DE 101 62 676, in particular since the coefficient of thermal expansion of the plastic housing composition with filling particles differs from the coefficient of expansion of the semiconductor material of the semiconductor chip. Since the polymer in the semiconductor component according to the invention is not filled with coarse mineral-ceramic particles like the plastic composition, but rather comprises embedded mineral-ceramic nanoparticles, the passivation layer of the semiconductor component according to the invention constitutes a mechanical buffer between the sensitive topmost metallization with an interconnect structure and the plastic housing composition with coarse ceramic filler particles. Furthermore, the passivation layer supplies good linking of the plastic housing composition to the top side of the semiconductor chip or to the surface of the passivation layer.

The material combination of polymer with embedded mineral-ceramic nanoparticles thus ensures the following advantageous properties:

1. a sufficient electrical insulation strength;
2. a protection of the semiconductor chip top side against fractures on account of high mechanical stress;
3. a protection of the topmost interconnect structure against deformation due to scratches, caused for example by the coarse filler particles of the plastic housing composition;
4. a sufficient linking of the plastic housing composition to the semiconductor chip top side, which prevents delamination during operation or during the reliability test to be carried out;
5. an improved heat dissipation of the power loss of the semiconductor chip during operation from the active top side of the semiconductor chip through the passivation layer composed of polymer with embedded mineral-ceramic nanoparticles.

In one preferred embodiment of the invention, the nanoparticles have an average grain size k within the range of 10 nm$\leq$k<1000 nm. With this average grain size, the mineral-ceramic nanoparticles attain a size which is suitable for the application to a topmost metal layer or a topmost interconnect structure and which prevents deep scratches and interruptions and also fractures from being able to occur in the topmost interconnect structure. In addition, the compliant polymeric component ensures that the brittle, closed silicon nitride layer that is at risk of fracture is no longer required as passivation layer.

It is now possible, with the aid of the mixture composed of polymer and nanoparticles, to achieve a coating that does not damage the surface of the semiconductor chip and, on the other hand, to form a sufficiently compliant layer which bridges the different coefficients of expansion of housing composition and semiconductor chip material. The nanoparticles preferably have an average grain size k within the range of 10 nm$\leq$k$\leq$100 nm. What is achieved by restricting the range to this average grain size is that the risk of scratching due to interruption of the topmost interconnect structure of the semiconductor chip by the passivation layer practically cannot occur.

In a further preferred embodiment of the invention, the nanoparticles are of virtually spherical form, as is known for the fullerenes. These are nanoparticles based on carbon, but do not form diamond lattices, but rather a surface of hexagonally arranged carbon rings. As long as such fullerenes are distributed uniformly in the polymer, electrical short circuits do not occur either, despite the electrical conductivity of these carbon nanoparticles.

In a further preferred embodiment of the invention, the passivation layer comprises nanoparticles from the group $Si_3N_4$, SiC, $SiO_2$, $ZrO_2$, $TiO_2$, AlN, $Al_2O_3$ and/or synthetic nanodiamond particles. These ceramic nanoparticles have the advantage they are mechanically and chemically stable and remain stable as incorporations or filler in the polymer. On account of their very large surface area in relation to the volume, these ceramic particles have an extremely high scratch resistance, which reduces the abovementioned risk of scratching or breaking of the interconnect structure of conventional filling materials in the micrometers range. Cracking in this passivation layer and damage to the topmost interconnect structure or the aluminum metallization are therefore extremely unlikely. At the same time, the nanoparticles in said group contribute to improving the insulation strength of the passivation layer by means of the combination of polymer/ceramic nanoparticles.

While the breakdown field strength of $Si_3N_4$ is >20 KV/mm, high-performance polymers that achieve a breakdown field strength of >60 KV/mm are formed with the passivation layer according to the invention composed of the combination of polymer/nanoparticles. The thermal conductivity of the passivation layer is also improved since, conventionally, a silicon nitride layer having good thermal conductivity is combined with a polyimide layer having weak to poor thermal conductivity. The thermal conductivity of the polymer/nanoparticle layer is improved ten-fold compared with such a polyimide layer. Even though the silicon nitride layer has an increased thermal conductivity, the known structure composed of passivation layers with a silicon nitride layer and with a polyimide layer is nevertheless burdened with a "heat barrier", especially as the polyimide layer having a thickness of between 1 μm and 30 μm is thicker by a multiple than the silicon nitride layer with its thickness of between 100 nm and 300 nm.

In a further embodiment of the invention, the passivation layer has a proportion of nanoparticles of 20% by volume to 90% by volume. In this case, the higher value of 90% by volume is more interesting because it also entails an improvement in the thermal conductivity. A range for the proportion of the nanoparticles in the passivation layer of 50% by volume to 80% by volume is preferably provided. What is achieved with this high proportion of ceramic nanoparticles in the polymer is that an intensive heat dissipation of the heat loss of the semiconductor chip can be ensured.

It is furthermore provided that the passivation layer comprises at least one polymer from the group high-temperature thermoplastics, polyimide precursors, polyamideimides, polybenzoxazoles, polyimidazoles, polycyclooctenes, polyaryletherketones, polyethersulfones, siloxanes and/or liquid crystalline polymers. What is common to these polymers is that they form compliant layers and enter into a stable mechanical intermeshing with the plastic housing composition, thereby preventing delamination between semiconductor chip surface with passivation layer and plastic housing composition.

It is furthermore provided that the passivation layer has a layer thickness d of 1 μm≦d≦50 μm. The nanoparticles make it possible, on the one hand, to configure such thin passivation layers which are only 1 μm thick and nevertheless afford all the advantages of a conventional multilayer passivation layer. On the other hand, it is possible, by means of the polymer, to realize a layer having an arbitrary thickness up to 50 μm which ensures a high degree of compliance and hence compensation of the thermal stresses between the plastic housing composition and the semiconductor chip material.

The passivation layer preferably has a thickness of between 3 μm≦d≦20 μm, whereby a production-technologically advantageous compromise between minimum space requirement and sufficient compliance of the layer is achieved in an advantageous manner.

The breakdown field strength $F_D$ for a passivation layer comprising nanoparticles is preferably $F_D \geq 40$ KV/mm. With this breakdown field strength, the passivation layer of the semiconductor component according to the invention achieves a breakdown field strength value that is virtually twice as high compared with the pure ceramic silicon nitride layer as a passivation layer produced in the front end area. Front end area should be understood here to mean a production area which concludes the production of a semiconductor wafer. In the back end area, which follows the front end area in terms of production technology, the risk of delamination of the semiconductor chip with respect to the plastic housing composition too high unless a second polymeric passivation layer is additionally applied to the first ceramic passivation layer.

The passivation layer of the semiconductor component according to the invention comprising 80% by volume of $Si_3N_4$ nanoparticles preferably has a thermal conductivity λ of λ≧5 W/mK. As already mentioned above, this value is more than a factor of 10 higher than the thermal conductivity λ which can be achieved with a passivation layer composed of pure polymer, such as a polyimide.

A method for producing semiconductor chips comprising a passivation layer has the following method steps. The first step involves producing a semiconductor wafer with semiconductor chip positions including a topmost interconnect structure with contact areas. Afterward, a protective layer is selectively applied to the contact areas, while the rest of the top side of the semiconductor wafer remains free of the protective layer. In parallel or beforehand, a polymer is mixed with mineral-ceramic nanoparticles and this mixture is then applied to the topmost interconnect structure of the semiconductor wafer. After this layer has been applied to the semiconductor wafer, the contact areas are freed of the protective layer. This can be prepared by swelling of the protective layer and the protective layer can then be rinsed away with the overlying material of the passivation layer. Finally, the semiconductor wafer is separated into semiconductor chips with passivation layer.

The advantage of this method is that an elastic insulation and protective layer in the form of a passivation layer which has good thermal conductivity and in addition is mechanically very stable is applied to the topmost interconnect layer of a semiconductor wafer and thus of a semiconductor chip by means of a single process step. An optimum linking of the plastic molding composition for the construction of a semiconductor component is simultaneously ensured in this case. This method dispenses with separate application of a silicon nitride passivation layer. Consequently, the method according to the invention replaces the two separate processes, namely the application of a silicon nitride layer in the front end area and the subsequent application of a polymer layer to the silicon nitride layer in the back end area, by a single process step.

In one preferred exemplary implementation of the method, the selective application of the protective layer to the contact areas is effected by means of photolithography. For this purpose, a photosensitive resist layer is applied to the semiconductor wafer, which resist layer is subsequently exposed by means of a mask at the locations of the contact areas, such that the photoresist crosslinks there and remains as protective layer on the contact areas during a subsequent development and fixing process. This method requires a special mask for shielding the surface regions that are not to be protected from exposure.

An alternative, mask-free possibility consists in the protective layer being applied to the contact areas by means of jet printing writing technology. In the case of jet printing writing technology, in a manner similar to that in an inkjet printer, the polymer is diluted with the nanoparticles in such a way that it can be applied precisely on the contact areas by means of an inkjet printer head. On the other hand, this technology also makes it possible to apply a mixture of polymer solvent and nanoparticles to the top side of the semiconductor wafer whilst leaving the contact areas free, in order to produce a passivation layer on the topmost interconnect layer.

In a further exemplary implementation of the method, the mixing of a polymer with mineral-ceramic nanoparticles is effected by means of melting a polymeric thermoplastic material with introduction of 10% by volume to 80% by volume of nanoparticles into the melt. This method variant advantageously utilizes the property of a thermoplastic material of melting at high temperatures to form a liquid, into which the envisaged proportion of nanoparticles can then be mixed.

In a further exemplary implementation of the method, the mixing of a polymer with mineral-ceramic nanoparticles is effected by means of producing a runny low-viscosity solution composed of solvent and polymeric material with introduction of 10% by volume to 80% by volume of nanoparticles into the solution. The introduction of a solvent enables the viscosity of the mixture to be set as desired, such that the properties of the mixture can be adapted to a wide variety of application methods and coating technologies in an advantageous manner. By way of example, the composite mixture is set with a suitable solvent to a low viscosity that can be processed by an inkjet coater.

The use of uncoated nanoparticles in the mixture of polymer nanoparticles and a solvent can lead, given a high solvent content, to a homogenous ceramic layer directly at the chip surface. The lower the viscosity of the mixture, the higher the probability that such a homogenous ceramic layer can form directly above the topmost interconnect structure. In this case, the high surface energy of the nanoparticles supports their agglomeration to form nanoparticle agglomerates. The sedimentation of the particles on the topmost interconnect structure is supported by the higher density of the nanoparticle agglomerates in comparison with the density of the polymer. Through suitable measures, it is possible to prevent this sedimentation and also the tendency toward agglomeration of the nanoparticles.

In an alternative method for producing semiconductor chips comprising a passivation layer, the following method steps are carried out. The first step involves also implementing a semiconductor wafer with semiconductor chip positions including a topmost interconnect structure with contact areas. Afterward, as in the first case, a protective layer is applied selectively to the contact areas. However, instead of simple mixing of nanoparticles with a polymer, use is then made of a method step in which firstly the mineral-ceramic nanoparticles are individually encapsulated with a polymer layer.

This has the advantage that a more uniform distribution of the nanoparticles in the passivation layer to be formed occurs. Moreover, the nanoparticles are prevented from combining to form large-volume, i.e. in the $\mu m$ range, occurring agglomerates of nanoparticles. These nanoparticles with a polymeric encapsulation are then applied as passivation layer to the topmost interconnect structure of the semiconductor component. After this layer has been formed, the protective layer is removed from the contact areas and the semiconductor wafer is separated into semiconductor chips with passivation layer. This alternative method has the advantage that an agglomeration of nanoparticles is prevented to the greatest possible extent and sedimentation to form a closed ceramic layer on the topmost interconnect structure is likewise prevented. In this case, the polymer coating has a layer thickness of significantly less than 100 nm. Such a coating of the individual nanoparticles furthermore serves for covalent binding of the particles to the polymer.

Preferably, the encapsulation of the mineral-ceramic nanoparticles with a polymer layer is effected in a fluidized bed furnace, the nanoparticles being swirled in a spray mist of polymer material. A further possibility for providing the mineral-ceramic nanoparticles with an encapsulation composed of polymer consists in introducing the nanoparticles in a spray tower preferably in countercurrent, in which a spray mist of polymer coats the particles.

After the application of such a layer composed of coated nanoparticles or composed of a solution of nanoparticles and polymer in a solvent, by means of a thermal step in which the temperature is typically >200° C., the solvent is evaporated and possibly the polymer stage is thermally cured, but at least the coatings of the nanoparticles are sintered together with one another. In the case of the jet printing method or the inkjet coating method, a highly selective and material-saving layer application to the chip surface or the semiconductor wafer surface is possible.

In this method variant, the bonding wire connection regions in the form of contact areas can advantageously be omitted or kept free from the coating. Consequently, the layer application can be applied either over the whole area onto a wafer in the so-called front end process or else later onto semiconductor chip surfaces that have already been separated, in which case said semiconductor chips may already be provided with corresponding connecting elements, such as bonding wires.

A further possibility for applying the passivation layer is afforded by the so-called "spin-coating" method. The composite mixture composed of a polymer, the nanoparticles and a suitable solvent is spun onto the semiconductor wafer during the "spin-coating" method. In this method, the aluminum wire connection regions or contact areas of the semiconductor wafer can either be masked beforehand or be concomitantly coated in unmasked fashion. If they have been concomitantly coated, then they must subsequently be freed of the passivation layer in order to enable an electrical connection in the form of a bonding connection.

In order to produce a semiconductor component, recourse is had to the method steps outlined previously by means of which semiconductor chips were firstly produced. Said semiconductor chips are then applied to a system carrier in order to produce a semiconductor component. Such a system carrier may be a leadframe or a wiring substrate such as is used for BGA housings (ball grid array housings). The contact areas of the semiconductor chip are subsequently connected via electrical connecting elements to external connections of the system carrier. In this case, the connecting elements may be flip-chip contacts of a semiconductor chip or bonding wires. Afterward, the connecting elements, the semiconductor chip and also the system carrier are embedded into a plastic housing composition with direct mechanical contact between the passivation layer on the semiconductor chip and the plastic housing composition into the latter. By means of these additional method steps, semiconductor components in which the risk of delamination between plastic housing composition and top side of the semiconductor chip is reduced are produced from the semiconductor chips.

To summarize, it can be established that the passivation layer composed of a high-performance polymer with nanoparticles is achieved by dissolving a polymer in a solvent or by introducing nanoparticles into a melt of a high-performance thermoplastic. The mineral-ceramic nanoparticles having a diameter of <1 μm have the effect that a higher thermal conductivity is achieved for the passivation layer and good coupling to the plastic housing composition is nevertheless possible. This mixture or this composite material can then be applied to the chip surface in an amount such that, depending on the application, after the thermal curing of the polymer or the solidification of the polymer melt of a thermoplastic or after evaporation of the solvent, a layer on the semiconductor chip having a thickness of 1 to 50 μm, preferably 3 to 20 μm is realized.

For the high-performance polymer, use is preferably made of polymers from the group high-temperature thermoplastics, polyimide precursors, polyamideimides, polybenzoxazoles, polyimidazoles, polycyclooctene, polyaryletherketones, polyethersulfones, siloxanes and/or liquid crystalline polymers (LCP), and nanoparticle materials from the group silicon nitride, silicon carbide, silicon dioxide, zirconium dioxide, titanium dioxide, aluminum nitride, aluminum dioxide and/or synthetic nanodiamond particles. The preferred proportion by volume of the ceramic filler particles relative to the mixture of polymer/nanoparticles is preferably between 20% by volume and 90% by volume.

BRIEF DESCRIPTION OF THE DRAWINGS

The invention will now be explained in more detail with reference to the accompanying figures.

FIG. 6 shows a schematic cross section of a semiconductor chip on a system carrier with sedimented ceramic layer on the top side of the semiconductor chip.

DETAILED DESCRIPTION

Figure 1:
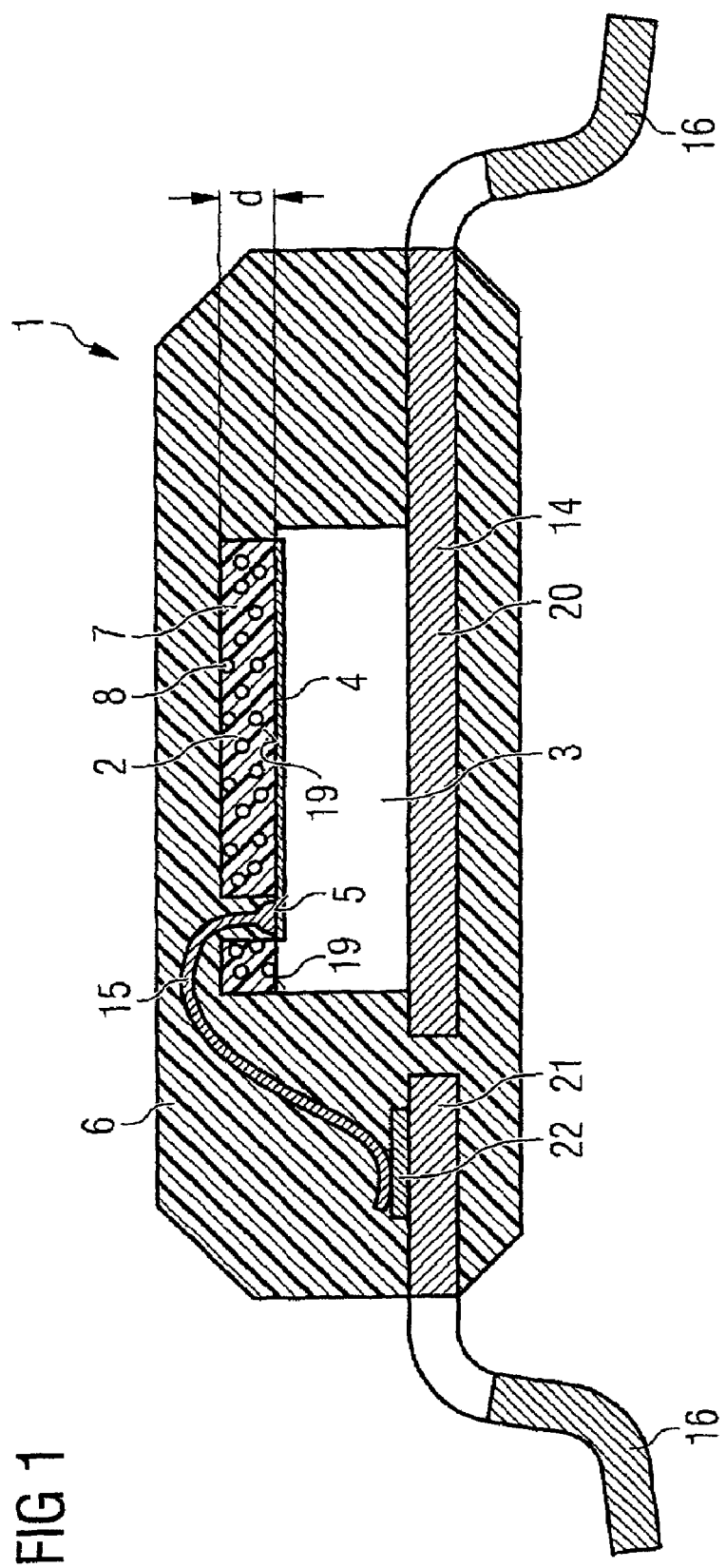
FIG. 1 shows a schematic cross section through a semiconductor component of one embodiment of the invention.

FIG. 1 shows a schematic cross section through a semiconductor component 1 of one embodiment of the invention. The semiconductor component 1 is constructed on a system carrier 14, which carriers a semiconductor chip 3 on an inner lead island 20. The lead island 20 is surrounded by inner leads 21, one inner lead 21 of which is shown in this cross section. The inner leads 21 undergo transition to external connections 16 in the form of outer leads. Arranged on the inner leads 21 are contact pads 22 on which end electrical connecting elements 15 in the form of bonding wires which connect the inner lead 21 and thus the external connections 16 to contact areas 5 on the active top side 19 of the semiconductor chip 3.

The active top side 19 of the semiconductor chip 3 has a topmost interconnect structure 4 covered by a passivation layer 2. The passivation layer 2 has a polymer 7 as host material, and mineral-ceramic nanoparticles 8 are incorporated into the polymer 7. The ceramic nanoparticles 8 provide for improved thermal conduction from the heat-loss-generating active top side 19 to the plastic housing composition 6 surrounding the semiconductor chip 3.

The plastic housing composition 6, into which are embedded both the semiconductor chip 3 with its passivation layer 2 and the connecting elements 15 and the inner leads 21 and also the inner lead island 20, is loaded with a filler composed of ceramic particles in order to adapt its coefficient of thermal expansion to the semiconductor chip 3, said ceramic particles not being nanoparticles, however, but rather having an average grain diameter in the range of a few tens of μm. In order to prevent, when embedding the semiconductor chip 3, said filler particles from damaging the topmost interconnect structure 4 of the semiconductor chip 3 by scratching and/or by interrupting the interconnect structure 4, the passivation layer 2 has nanoparticles 8 which preferably have a rounded contour and are present in an average grain size of 10 nm to 100 nm.

In this case, the thickness d of the passivation layer 2 is between 1 μm and 50 μm. The polymer as host material for the nanoparticles 8 has at the same time proved worthwhile as coupling material for the plastic housing composition 6. At the same time the surface of the passivation layer 2 becomes uneven by virtue of the nanoparticles 8, thus resulting in more intensive intermeshing with the plastic housing composition 6 and thereby reducing the risk of delamination between plastic housing composition 6 and passivation layer 2.

Figure 2:
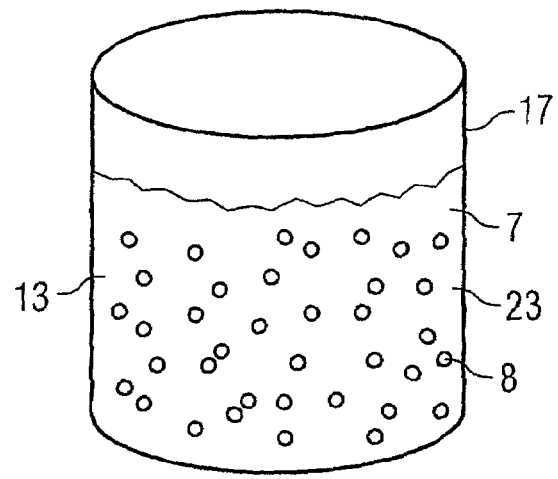
FIG. 2 shows a container for producing a mixture of polymer, solvent and nanoparticles to form a composite solution for a passivation layer.

FIG. 2 shows a container 17 for producing a mixture composed of polymer 7, solvent 23 and nanoparticles 8 to form a composite solution 13 for a passivation layer. For this purpose, in the container 17 firstly the polymer 7 is dissolved in the solvent 23 and then the nanoparticles 8 without any encapsulation are introduced into this solution 13. The composite solution 13 composed of polymer 7, nanoparticles 8 and solvent 23 has to be kept in motion in order to avoid agglomeration on account of the high surface tension of the nanoparticles 8 and furthermore to prevent sedimentation of the nanoparticles 8 on the bottom of the container 17.

Another possibility for combining nanoparticles 8 with a polymer 7 consists in surrounding the nanoparticles 8 with an encapsulation of a polymer 7. Such an encapsulation of nanoparticles 8 can be performed in a spray container or in a fluidized bed furnace by the nanoparticles 8 being moved in countercurrent into a spray mist of polymer 7 and being surrounded with an encapsulation composed of a polymer 7 in the process. Nanoparticles 8 encapsulated in this way and their processing are shown in the subsequent FIGS. 3 and 4.

Figure 3:
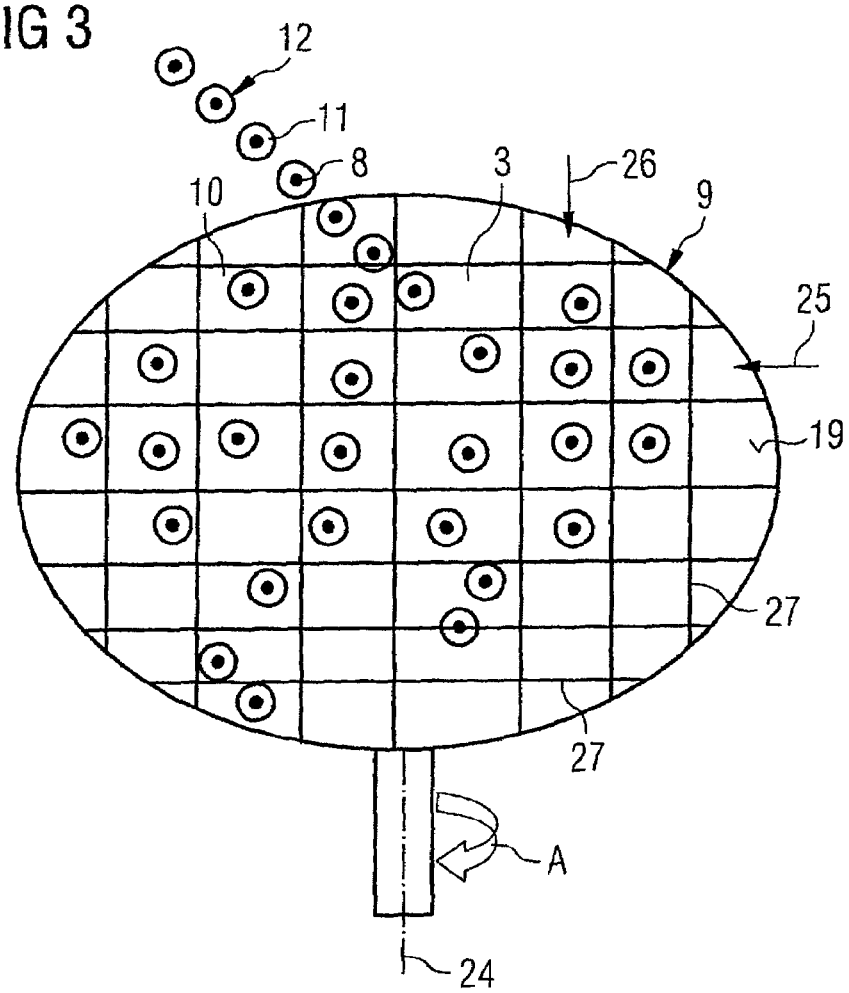
FIG. 3 shows a schematic diagram of a spin-coating technology for applying a passivation layer to a semiconductor wafer.

FIG. 3 shows a schematic diagram of a spin-coating technology. In this spin-coating technology, encapsulated nanoparticles 12 are sprayed onto the top side 19 of a semiconductor wafer 9 from a spray nozzle or jet nozzle 28, the semiconductor wafer 9 simultaneously being rotated about an axis 24 in rotation direction A and the sprayed-on material thus being distributed uniformly on the top side 19 of the semiconductor wafer 9. The semiconductor wafer 9 itself has semiconductor chip positions 10 arranged in rows 25 and columns 26. After the application and curing of the polymer with nanoparticles 8 on the top side 19 of the semiconductor wafer 9, the semiconductor wafer 9 can be separated into semiconductor chips 3 along separating tracks 27. Previously, however, in the semiconductor chip positions 10 contact areas are uncovered for fitting connecting elements in each of the semiconductor chip positions 10.

Figure 4:
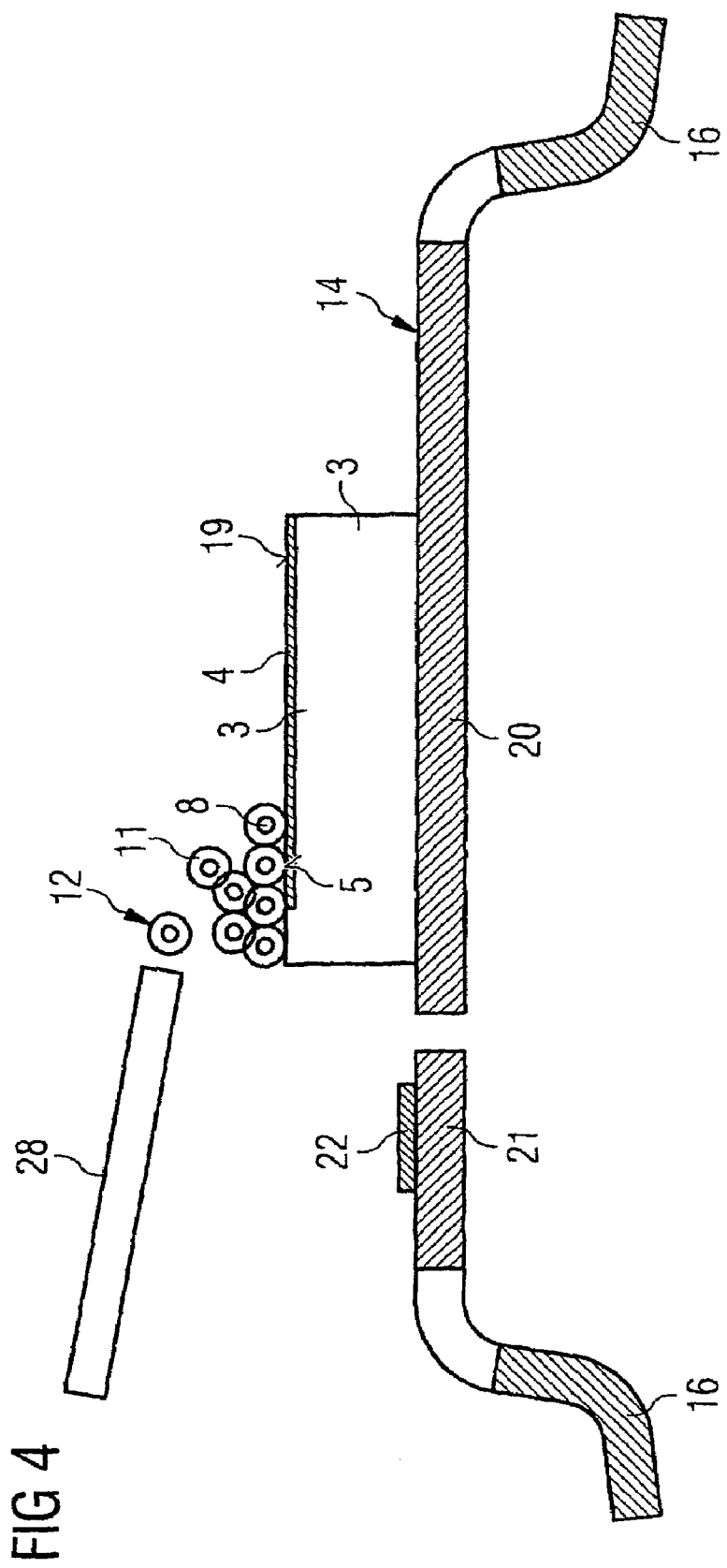
FIG. 4 shows a schematic diagram of a jet printing technology for applying a passivation layer to a semiconductor chip mounted on a system carrier.

FIG. 4 shows a schematic diagram of a jet printing technology for applying a passivation layer to a semiconductor chip 3 mounted on a system carrier 14. In this case, prior to the application of a passivation layer, the semiconductor wafer 9 shown in FIG. 3 is separated into individual semiconductor chips 3 and the latter are applied to the system carrier shown in FIG. 4. The system carrier 14 has an inner lead island 20 for receiving the semiconductor chip 3, onto which lead island the semiconductor chip 3 can be adhesively bonded or soldered. Furthermore, the system carrier 14 has inner leads 21 which are provided with a contact pad 22 and surround the inner lead island 20.

In this case, encapsulated nanoparticles 12 with their encapsulating polymer layer 11 are applied to the surface 19 of the semiconductor chip 3 by means of a jet nozzle 28 as in the case of an inkjet nozzle, in which case the encapsulated nanoparticles 12 can be applied directly to the topmost interconnect structure 4 whilst omitting the contact areas 5 of the semiconductor chip 3. This omission or leaving free of the contact areas 5 is not shown in this example of FIG. 4; here, rather, the encapsulated nanoparticles 12 are applied uniformly to the top side 19 of the semiconductor chip 3 by means of the jet nozzle 28 and the contact area 5 is subsequently uncovered. In order to form a closed layer of encapsulated nanoparticles 12, the semiconductor chip 3 is brought to a temperature in the region of 200° C. in a heat treatment step in order that the encapsulation of polymer can form a compact layer with incorporated nanoparticles 8.

Figure 5:
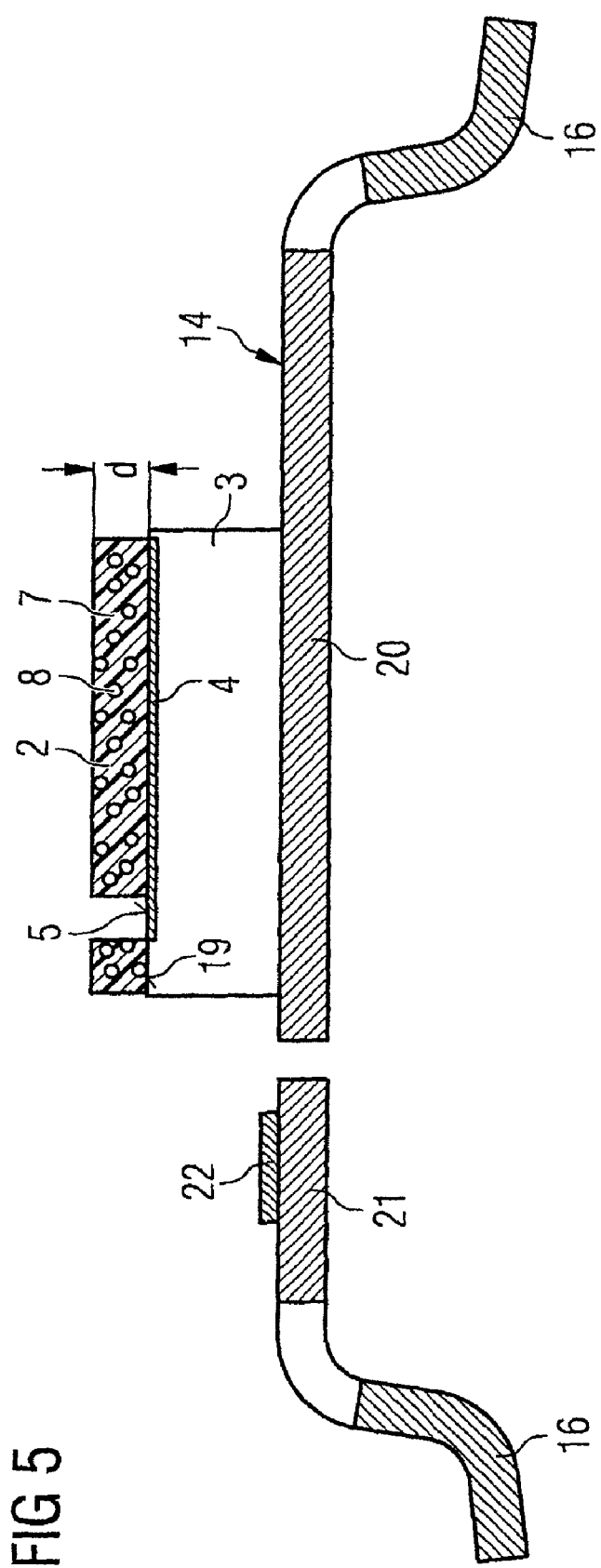
FIG. 5 shows a schematic cross section of a semiconductor chip on a system carrier with applied passivation layer.

FIG. 5 shows a schematic cross section of a semiconductor chip 3 on a system carrier 14 with applied passivation layer 2.

Consequently, FIG. 5 shows the result of the heat treatment step after the application of the encapsulated nanoparticles and the uncovering of the contact area 5 of the semiconductor chip 3. Components having the same functions as in the previous figures are identified by the same reference symbols and are not discussed separately.

FIG. 6 shows a schematic cross section of a semiconductor chip 3 on a system carrier 14 with sedimented ceramic layer 18 on the top side 19 of the semiconductor chip 3. Said sedimented ceramic layer 18 comprises agglomerates of nanoparticles which are formed with low viscosity in a composite solution and, on account of their higher density compared with the surrounded polymer 7 of the composite solution, sediment on the topmost interconnect structure 4. Consequently, a virtually particle-free polymer layer 29 is formed on the top side of the sedimented ceramic layer 18. For this purpose, the evaporation of the solvent from or out of the composite solution must be impeded until the sedimentation is concluded.

The invention claimed is:

1. An integrated circuit component, comprising:
   an integrated circuit chip comprising a topmost interconnect structure and contact areas disposed on a top side of the chip;
   a passivation layer covering the topmost interconnect structure while leaving the contact areas free, the passivation layer comprising a polymer with embedded mineral-ceramic nanoparticles; and
   a plastic housing composition in direct adhesive contact with the passivation layer.

2. The integrated circuit component as claimed in claim 1, wherein the nanoparticles have an average grain size k within the range of 10 nm $\leq$ k $\leq$ 1000 nm.

3. The integrated circuit component as claimed in claim 1, wherein the nanoparticles have an average grain size k within the range of 10 nm $\leq$ k $\leq$ 1000 nm.

4. The integrated circuit component as claimed in claim 1, wherein the passivation layer comprises nanoparticles from the group $Si_3N_4$, SiC, $SiO_2$, $ZrO_2$, $TiO_2$, AlN, $Al_2O_3$, and synthetic nanodiamond particles.

5. The integrated circuit component as claimed in claim 1, wherein the nanoparticles have a proportion in the passivation layer of 20% by volume to 90% by volume.

6. The integrated circuit component as claimed in claim 1, wherein the nanoparticles have a proportion in the passivation layer of 50% by volume to 80% by volume.

7. The integrated circuit component as claimed in claim 1, wherein the passivation layer comprises at least one polymer from the group: high-temperature thermoplastics, polyimide precursors, polyamideimides, polybenzoxazoles, polyimidazoles, polycyclooctenes, polyaryletherketones, polyethersulfones, siloxanes, and liquid crystalline polymers.

8. The integrated circuit component as claimed in claim 1, wherein the passivation layer has a layer thickness (d) of 1 µm $\leq$ d $\leq$ 50 µm.

9. The integrated circuit component as claimed in claim 1, wherein the passivation layer has a layer thickness (d) of 3 µm $\leq$ d $\leq$ 20 µm.

10. The integrated circuit component as claimed in claim 1, wherein the passivation layer has a breakdown field strength $F_D \geq 40$ KV/mm.

11. The integrated circuit component as claimed in claim 1, wherein the passivation layer comprises at least about 80% by volume of $Si_3N_4$ nanoparticles and has a thermal conductivity $\lambda$ of $\lambda \geq 5$ W/mk.

* * * * *